United States Patent
Ohkoshi et al.

(10) Patent No.: US 11,980,013 B2
(45) Date of Patent: May 7, 2024

(54) RADIO WAVE-ABSORBING LAMINATE FILM, PRODUCTION METHOD THEREFOR, AND ELEMENT INCLUDING SAME

(71) Applicants: The University of Tokyo, Tokyo (JP); TOKYO OHKA KOGYO CO., LTD., Kawasaki (JP)

(72) Inventors: Shin-ichi Ohkoshi, Tokyo (JP); Asuka Namai, Tokyo (JP); Marie Yoshikiyo, Tokyo (JP); Takahiro Asai, Kawasaki (JP); Masaru Kuwahara, Kawasaki (JP)

(73) Assignees: The University of Tokyo, Tokyo (JP); Tokyo Ohka Kogyo Co., Ltd., Kawasaki (JP)

( * ) Notice: Subject to any disclaimer, the term of this patent is extended or adjusted under 35 U.S.C. 154(b) by 640 days.

(21) Appl. No.: 15/734,079

(22) PCT Filed: May 30, 2019

(86) PCT No.: PCT/JP2019/021622
§ 371 (c)(1),
(2) Date: Dec. 1, 2020

(87) PCT Pub. No.: WO2019/235364
PCT Pub. Date: Dec. 12, 2019

(65) Prior Publication Data
US 2021/0227730 A1   Jul. 22, 2021

(30) Foreign Application Priority Data

Jun. 6, 2018   (JP) ................................ 2018-108946

(51) Int. Cl.
*H05K 9/00* (2006.01)
*B32B 7/025* (2019.01)
(Continued)

(52) U.S. Cl.
CPC ........... *H05K 9/0088* (2013.01); *B32B 7/025* (2019.01); *B32B 15/04* (2013.01); *H01F 1/34* (2013.01);
(Continued)

(58) Field of Classification Search
None
See application file for complete search history.

(56) References Cited

U.S. PATENT DOCUMENTS 2,877,286 A * 3/1959 Vance .................... H01J 29/06
174/394
4,522,890 A * 6/1985 Volkers ................. H01Q 17/00
428/685

(Continued)

FOREIGN PATENT DOCUMENTS

JP  2000-040893 A  2/2000
JP  3086324 U  6/2002
(Continued)

OTHER PUBLICATIONS

Namai et al. Synthesis of an Electromagnetic Wave Absorber for High-Speed Wireless Communication. Article Journal of American Chemical Society pp. 1170-1173, 2009.

(Continued)

*Primary Examiner* — Bernarr E Gregory
(74) *Attorney, Agent, or Firm* — Knobbe, Martens, Olson & Bear, LLP

(57) ABSTRACT

A radio wave-absorbing laminate film in which both the top surface and the bottom surface have superior transmission attenuation properties and reflection attenuation capabilities in extremely high-frequency wave bands and higher, and which exhibits excellent radio wave absorption properties even when extremely thin; a production method for the film; and an element containing the film. A radio wave-absorbing
(Continued)

laminate film having radio wave-absorbing layers, the radio wave-absorbing laminate film including a center layer, two substrate layers, and two radio wave-absorbing layers, the center layer containing at least one metal layer, and the two substrate layers being laminated on both surfaces of the center layer. With regard to each of the two substrate layers, the radio wave-absorbing layer is laminated on the surface opposite to the center layer, and, the two substrate layers are the same or different, the two radio wave-absorbing layers are the same or different, and at least one of the radio wave-absorbing layers contains a magnetic body.

8 Claims, 6 Drawing Sheets

(51) Int. Cl.
    *B32B 15/04*     (2006.01)
    *H01F 1/34*     (2006.01)

(52) U.S. Cl.
    CPC ..... *B32B 2264/102* (2013.01); *B32B 2311/30* (2013.01)

(56) References Cited

U.S. PATENT DOCUMENTS

| | | | |
|---|---|---|---|
| 5,125,992 A * | 6/1992 | Hubbard | H01Q 17/00 29/458 |
| 9,674,992 B2 * | 6/2017 | Cheng | H05K 9/0088 |
| 2006/0083948 A1 | 4/2006 | Kawaguchi et al. | |
| 2010/0238063 A1 | 9/2010 | Ohkoshi et al. | |
| 2017/0288305 A1 | 10/2017 | Ohkoshi et al. | |
| 2020/0267877 A1 | 8/2020 | Hiroi et al. | |

FOREIGN PATENT DOCUMENTS

| | | |
|---|---|---|
| JP | 2008-174405 A | 7/2008 |
| JP | 2008-277726 A | 11/2008 |
| JP | 2009-060060 A | 3/2009 |
| JP | 2017-184106 A | 10/2017 |
| WO | WO 2018/004262 A1 | 1/2018 |
| WO | WO 2018/084235 A1 | 5/2018 |

OTHER PUBLICATIONS

Namai et al. Hard magnetic ferrite with a gigantic coercivity and high frequency millimeter wave rotation. Article Nature Communications pp. 1-6, 2012.

Ohkoshi et al. A Millimeter-Wave Absorber Based on Gallium-Substituted e-Iron Oxide Nanomagnets Angew. Chem. Int. Ed., 46, pp. 8392-8395, 2007.

Jin et al. Giant Coercive Field of Nanometer-sized Iron Oxide. Advance Materials, pp. 48-51, 2004.

Ohkoshi et al. The addition effects of alkaline earth ions in the chemical synthesis of Fe2O3 nanocrystals that exhibit a huge coercive field. Article, Journal of Applied Physics, pp. 97, 2005.

Sakurai et al. Reorientation Phenomenon in a Magnetic Phase of –Fe2O3 Nanocrystal, Journal of the Physical Society of Japan, vol. 74, No. 7 pp. 1946-1949, 2005.

* cited by examiner

RADIO WAVE-ABSORBING LAMINATE FILM, PRODUCTION METHOD THEREFOR, AND ELEMENT INCLUDING SAME

CROSS-REFERENCE TO RELATED APPLICATIONS

This application is the U.S. National Phase under 35 U.S.C. § 371 of International Application PCT/JP2019/021622, filed May 30, 2019, designating the U.S., and published in Japanese as WO 2019/235364 on Dec. 12, 2019 which claims priority to Japanese Patent Application No. 2018-108946, filed Jun. 6, 2018, the entire contents of which are incorporated herein by reference.

TECHNICAL FIELD

The present invention relates to a radio wave absorbing laminate film having excellent transmission attenuation and reflection attenuation properties in a millimeter-wave band or higher on a top surface and a bottom surface, respectively, and exhibiting satisfactory radio wave absorbing performance even when the film is designed to be extremely thin; a method for producing the film; and an element including the film.

BACKGROUND ART

Radio waves in a high-frequency band are increasingly being used in various information communication systems such as cellular telephones, wireless local area networks (LANs), electronic throttle control (ETC) systems, intelligent transport systems, driving support road systems, satellite broadcasting, and the like. However, the increasing use of the radio waves in a high-frequency band involves a risk of failure and malfunction of electronic devices due to interference between electronic parts. In order to address such a problem, a method of absorbing unnecessary radio waves by a radio wave absorber has been employed.

Accordingly, in a radar or the like using the radio waves in a high-frequency band, radio wave absorbers have been used in order to reduce the influence of unnecessary radio waves that should not be received. In order to meet such a demand, various radio wave absorbers capable of satisfactorily absorbing the radio waves in a high-frequency band have been proposed. Well-known specific examples thereof include radio wave absorbing sheets including a carbon nano-coil and a resin (e.g., Patent Document 1).

Among applications of the radio waves in a high-frequency band, research on operation support systems for automobiles has progressed. In such operation support systems for automobiles, radio waves in a 76-GHz band have been utilized in automotive radars for detecting an inter-vehicular distance and the like. In various applications not just limited to the operation support systems, the radio waves in a high-frequency band, for example, in 100 GHz or higher are expected to be increasingly used. Therefore, there is a need for radio wave absorbers capable of satisfactorily absorbing radio waves in the 76-GHz band or higher frequency band.

In order to meet such a demand, for example, a radio wave absorber that includes a radio wave absorbing layer including a magnetic crystal composed of $\varepsilon\text{-Fe}_2\text{O}_3$-based iron oxide has been proposed as a radio wave absorber capable of satisfactorily absorbing radio waves over a wide range in a high-frequency band (e.g., Patent Document 2 and Non-Patent Documents 1 to 3).

Patent Document 1: Japanese Unexamined Patent Application, Publication No. 2009-060060
Patent Document 2: Japanese Unexamined Patent Application, Publication No. 2008-277726
Non-Patent Document 1:
A. Namai, S. Sakurai, M. Nakajima, T. Suemoto, K. Matsumoto, M. Goto, S. Sasaki, and S. Ohkoshi, J. Am. Chem. Soc., 131, 1170-1173(2009).
Non-Patent Document 2:
A. Namai, M. Yoshikiyo, K. Yamada, S. Sakurai, T. Goto, T. Yoshida, T Miyazaki, M. Nakajima, T. Suemoto, H. Tokoro, and S. Ohkoshi, Nature Communications, 3, 1035/1-6(2012).
Non-Patent Document 3:
S. Ohkoshi, S. Kuroki, S. Sakurai, K. Matsumoto, K. Sato, and S. Sasaki, Angew. Chem. Int. Ed., 46, 8392-8395(2007).

DISCLOSURE OF THE INVENTION

Problems to be Solved by the Invention

In conventional radio wave absorbers capable of being used as millimeter-wave absorbers, there has been demanded to thicken a radio wave absorbing layer in order to achieve a sufficient millimeter-wave absorbing property or to allow a metal layer to adhere to a substrate layer including a radio wave absorbing layer. However, in the case of thickening the radio wave absorbing layer, there are problems in that production cost of the radio wave absorber is increased and it is difficult to downsize the absorber. Furthermore, a radio wave absorber in which the metal layer adheres to the substrate layer has the problem described below. The radio wave absorber having such a configuration typically includes the radio wave absorbing layer on one side and the metal layer on the other side. In the case of using the radio wave absorber having such a configuration in order to absorb unnecessary radio waves incident on Radio Frequency Integrated Circuit (RFIC), the metal layer is arranged so as to oppose the RFIC. Thus, the unnecessary radio waves transmitting from a radio wave absorbing layer side to a metal layer side can be attenuated and the unnecessary radio waves can be suppressed from being incident on the RFIC. However, in this case, noise emitted from the RFIC towards a surface (metal layer) of the radio wave absorber opposite to the radio wave absorbing layer is totally reflected by the metal layer. As a result, reflected noise causes a risk of failure and malfunction of electronic devices due to interference between electronic parts. For such a reason, there is a need for a film-shaped radio wave absorber having a transmission attenuation property, which is a property of attenuating radio waves to be transmitted, and a reflection attenuation property, which is a property of attenuating radio waves to be reflected, on a top surface and a bottom surface, respectively, and exhibiting satisfactory radio wave absorbing performance even when the absorber is designed to be extremely thin.

The present invention has been made in view of the above-described problem, and an object thereof is to provide a radio wave absorbing laminate film having excellent transmission attenuation and reflection attenuation properties in a millimeter-wave band or higher on a top surface and a bottom surface, respectively, and exhibiting satisfactory radio wave absorbing performance even when the film is designed to be extremely thin; a method for producing the film; and an element including the film.

Means for Solving the Problems

The present inventors have completed the present invention by finding that a radio wave absorbing laminate film having excellent transmission attenuation and reflection attenuation properties in a millimeter-wave band or higher on a top surface and a bottom surface, respectively, and exhibiting satisfactory radio wave absorbing performance even when the film is designed to be extremely thin can be produced by including at least one metal layer in a core layer of a radio wave absorbing laminate film that has a certain layer configuration including two radio wave absorbing layers, two substrate layers, and one core layer.

A first aspect of the present invention relates to a radio wave absorbing laminate film including: a radio wave absorbing layer; the radio wave absorbing laminate film including a core layer, two substrate layers, and two radio wave absorbing layers; the core layer including at least one metal layer; the two substrate layers being laminated on both surfaces of the core layer; the radio wave absorbing layer being laminated on a surface opposite to the core layer for each of the two substrate layers; the two substrate layers being either the same as or different from each other, the two radio wave absorbing layers being either the same as or different from each other; and at least one of the radio wave absorbing layers including a magnetic substance.

A second aspect of the present invention relates to a method for producing the radio wave absorbing laminate film according to the first aspect, the method including:
(a1) performing formation of a laminated product at least twice including the radio wave absorbing layer and the substrate layer through formation of the radio wave absorbing layer on the substrate layer, thereby obtaining at least two laminated products; and
(b1) laminating a surface of the substrate layer of the laminated product onto each of both surfaces of the core layer.

A third aspect of the present invention relates to a method for producing the radio wave absorbing laminate film according to the first aspect, the method including:
(a2) laminating the substrate layer onto each of both surfaces of the core layer; and
(b2) forming the radio wave absorbing layer on each of the two substrate layers laminated on the core layer.

A fourth aspect of the present invention relates to an element including the radio wave absorbing laminate film according to the first aspect.

Effects of the Invention

The radio wave absorbing laminate film according to the first aspect has excellent transmission attenuation and reflection attenuation properties in a millimeter-wave band or higher on a top surface and a bottom surface, respectively, and exhibits satisfactory radio wave absorbing performance even when the film is designed to be extremely thin. Furthermore, the present invention can provide a method for producing the radio wave absorbing laminate film; and an element including the radio wave absorbing laminate film.

PREFERRED MODE FOR CARRYING OUT THE INVENTION

Although embodiments of the present invention will be described hereafter in detail, the present invention is not limited to the embodiments below in any way and can be implemented with modifications as appropriate within the scope of the object of the present invention. Furthermore, as used herein, "A to B" denotes A or more and B or less, unless otherwise noted.

<<Radio Wave Absorbing Laminate Film>>

Figure 1:
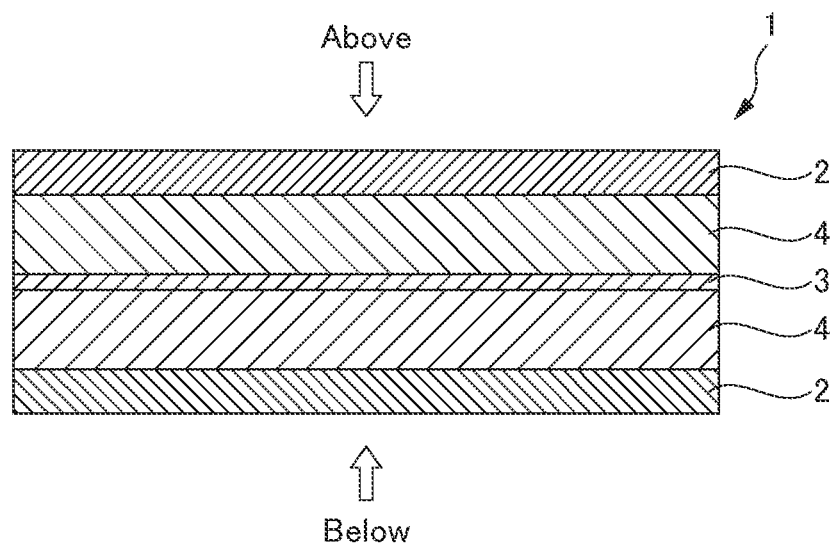
FIG. 1 illustrates a cross-sectional view of one preferred embodiment of a radio wave absorbing laminate film according to the first aspect.

FIG. 1 is a cross-sectional view of one preferred embodiment of the radio wave absorbing laminate film according to the first aspect. Referring to FIG. 1, the radio wave absorbing laminate film according to the first aspect will be described below. The radio wave absorbing laminate film according to the first aspect is a radio wave absorbing laminate film including a radio wave absorbing layer 2; the radio wave absorbing laminate film has a core layer 3, two substrate layers 4, and two radio wave absorbing layers 2; the core layer 3 includes at least one metal layer; the two substrate layers 4 are laminated on both surfaces of the core layer 3; the radio wave absorbing layer 2 is laminated on a surface opposite to the core layer 3 for each of the two substrate layers 4; the two substrate layers 4 may be the same as or different from each other, the two radio wave absorbing layers may be the same as or different from each other; and at least one of the radio wave absorbing layers 2 include a magnetic substance.

At least one surface (preferably, both surfaces) of the radio wave absorbing laminate film according to the first aspect has preferably a peak at which an absolute value of transmission attenuation is 10 decibels (dB) or more and an absolute value of reflection attenuation is 10 dB or more, more preferably a peak at which an absolute value of transmission attenuation is 20 dB or more and an absolute value of reflection attenuation is 20 dB or more within a frequency band of 30 gigahertz (GHz) or more (within a frequency band of preferably 30 GHz or more and 300 GHz or less and more preferably 40 GHz or more and 200 GHz or less), and further preferably a peak at which an absolute value of transmission attenuation is 20 dB or more within a frequency band of 30 GHz or more and an absolute value of reflection attenuation is 20 dB or more within a frequency band of 50 GHz or more and 100 GHz or less, from the viewpoint of the possibility of more secure absorption of radio waves at high frequencies in a millimeter-wave band or higher. The values of transmission attenuation and reflection attenuation are values as measured under the measurement conditions in Examples described below, unless otherwise noted.

The radio wave absorbing laminate film may have a curved surface or be only composed of a planar surface, and is preferably a flat plate shape. A thickness of the radio wave absorbing laminate film according to the first aspect is preferably 1000 µm or less, more preferably 900 µm or less, and further preferably 450 µm or less from the viewpoint of thinning or downsizing of the film without impairing the effect of the present invention.

<Two Radio Wave Absorbing Layer>

In the first aspect, the radio wave absorbing layer 2 is laminated on a surface opposite to the core layer 3 for each of the two substrate layers 4. Constitution (composition, thickness, physical property, and the like) of the two radio wave absorbing layers 2 may be the same as or different from each other. At least one of the radio wave absorbing layers 2 include a magnetic substance. Preferably, both radio wave absorbing layers 2 include the magnetic substance from the viewpoint of more secure achievement of the effect of the present invention.

The above-mentioned magnetic substance is preferably a magnetic substance magnetically resonating in a frequency band of 30 GHz or more and more preferably a magnetic substance magnetically resonating in a frequency band of 30 GHz or more and 300 GHz or less from the viewpoint of the possibility of absorption of radio waves at high frequencies in a millimeter-wave band or higher.

An example of the above-mentioned magnetic resonance includes magnetic resonance based on precession upon spin motion of electrons in atoms in a frequency band of a millimeter-wave band or higher. A preferred example thereof includes natural magnetic resonance by a gyromagnetic effect based on precession in a frequency band of a millimeter-wave band or higher.

The above-mentioned magnetic substance is not particularly limited as long as the magnetic substance can absorb radio waves at high frequencies in a millimeter-wave band or higher. Preferred examples of the magnetic substance include magnetic substances including at least one selected from the group consisting of epsilon-type iron oxide, barium ferrite magnetic substance, and strontium ferrite magnetic substance. Hereinafter, the epsilon-type iron oxide will be described.

(Epsilon-Type Iron Oxide)

The epsilon-type iron oxide is preferably at least one selected from the group consisting of an $\varepsilon\text{-Fe}_2O_3$ crystal; and a crystal of which crystalline structure and space group are the same as those of the $\varepsilon\text{-Fe}_2O_3$ crystal, in which a part of Fe sites in the $\varepsilon\text{-Fe}_2O_3$ crystal is substituted by an element M other than Fe, and which is represented by a formula $\varepsilon\text{-M}_x\text{Fe}_{2-x}O_3$ wherein x is 0 or more and 2 or less and preferably 0 or more and less than 2. Since crystals of the epsilon-type iron oxide are magnetic crystals, such crystals may also be referred to as "magnetic crystals" herein.

Any $\varepsilon\text{-Fe}_2O_3$ crystals can be used. The crystal of which crystalline structure and space group are the same as those of the $\varepsilon\text{-Fe}_2O_3$ crystal, in which a part of Fe sites in the $\varepsilon\text{-Fe}_2O_3$ crystal is substituted by an element M other than Fe, and which is represented by a formula $\varepsilon\text{-M}_x\text{Fe}_{2-x}O_3$ wherein x is 0 or more and 2 or less and preferably 0 or more and less than 2, is described later. It should be noted that $\varepsilon\text{-M}_x\text{Fe}_{2-x}O_3$, in which a part of Fe sites in the $\varepsilon\text{-Fe}_2O_3$ crystal is substituted by a substitution element M, is also referred to as "M-substituted $\varepsilon\text{-Fe}_2O_3$" herein.

A particle size of a particle having the $\varepsilon\text{-Fe}_2O_3$ crystal and/or the M-substituted $\varepsilon\text{-Fe}_2O_3$ crystal in a magnetic phase is not particularly limited without interfering with the objective of the present invention. For example, an average particle size, as measured from a TEM (transmission electron microscope) photograph, of a particle having a magnetic crystal of epsilon-type iron oxide in a magnetic phase, which is manufactured by way of a method to be described later, is within a range of 5 nm or more and 200 nm or less. Furthermore, a variation coefficient (standard deviation of particle size/average particle size) of the particles each having a magnetic crystal of epsilon-type iron oxide in a magnetic phase, which is manufactured by way of the method to be described later, is within a range of less than 80%, which means that the particles are relatively fine and uniform in particle size.

The preferable radio wave absorbing layers 2 use powder of such magnetic particles of epsilon-type iron oxide (in other words, particles having an $\varepsilon\text{-Fe}_2O_3$ crystal and/or an M-substituted $\varepsilon\text{-Fe}_2O_3$ crystal in a magnetic phase) as the magnetic substance, the radio wave absorbing material in the radio wave absorbing layers 2. As used herein, the "magnetic phase" is a part of the powder that carries a magnetic property. "Having an $\varepsilon\text{-Fe}_2O_3$ crystal and/or an M-substituted $\varepsilon\text{-Fe}_2O_3$ crystal in a magnetic phase" means that the magnetic phase is composed of an $\varepsilon\text{-Fe}_2O_3$ crystal and/or an M-substituted $\varepsilon\text{-Fe}_2O_3$ crystal, and includes a case in which an impurity magnetic crystal, which is inevitable in manufacturing, is mixed into the magnetic phase.

The magnetic crystal of epsilon-type iron oxide may include an impurity crystal of iron oxide having a space group and an oxidized state different from those of the $\varepsilon\text{-Fe}_2O_3$ crystal (specifically, $\alpha\text{-Fe}_2O_3$, $\gamma\text{-Fe}_2O_3$, FeO, and $Fe_3O_4$ crystals, as well as such crystals in which a part of Fe is substituted by other elements). In a case in which the magnetic crystal of epsilon-type iron oxide includes the impurity crystal, a main phase is preferably a magnetic crystal of $\varepsilon\text{-Fe}_2O_3$ and/or M-substituted $\varepsilon\text{-Fe}_2O_3$. In other words, in the magnetic crystal of epsilon-type iron oxide constituting the radio wave absorbing material, a ratio of the magnetic crystal of $\varepsilon\text{-Fe}_2O_3$ and/or M-substituted $\varepsilon\text{-Fe}_2O_3$ is preferably 50 mol % or more in a molar ratio as a compound.

An abundance ratio of crystals can be obtained by analysis through the Rietveld method based on X-ray diffraction pattern. Non-magnetic compounds generated in a sol-gel process such as silica ($SiO_2$) may be attached around the magnetic phase.

(M-Substituted $\varepsilon\text{-Fe}_2O_3$)

As long as the M-substituted $\varepsilon\text{-Fe}_2O_3$ satisfies the conditions that a crystalline structure and a space group are the same as those of the $\varepsilon\text{-Fe}_2O_3$ crystal, and that a part of Fe sites in the $\varepsilon\text{-Fe}_2O_3$ crystal is substituted by an element M other than Fe, a type of the element M in the M-substituted $\varepsilon\text{-Fe}_2O_3$ is not particularly limited. The M-substituted $\varepsilon\text{-Fe}_2O_3$ may include a plurality of types of element M other than Fe.

Preferred examples of the element M include In, Ga, Al, Sc, Cr, Sm, Yb, Ce, Ru, Rh, Ti, Co, Ni, Mn, Zn, Zr, and Y. Among these, In, Ga, Al, Ti, Co, and Rh are preferable. In a case in which M is Al, in a composition represented by $\varepsilon\text{-M}_x\text{Fe}_{2-x}O_3$, x is preferably within a range of, for example, 0 or more and less than 0.8. In a case in which M is Ga, x is preferably within a range of, for example, 0 or more and less than 0.8. In a case in which M is In, x is preferably within a range of, for example, 0 or more and less than 0.3. In a case in which M is Rh, x is preferably within a range of, for example, 0 or more and less than 0.3. In a case in which M is Ti and Co, x is preferably within a range of, for example, 0 or more and less than 1.

The frequency at which a radio wave absorption amount is maximum can be adjusted by adjusting at least one of a type and a substitution amount of the element M in the M-substituted ε-Fe$_2$O$_3$.

Such an M-substituted ε-Fe$_2$O$_3$ magnetic crystal can be synthesized by, for example, a combined process of a reverse micelle method and the sol-gel method described later, as well as a calcination process. The M-substituted ε-Fe$_2$O$_3$ magnetic crystal can also be synthesized by a combined process of a direct synthesis method and the sol-gel method as disclosed in Japanese Unexamined Patent Application Publication No. 2008-174405, as well as a calcination process.

Specifically, the M-substituted ε-Fe$_2$O$_3$ magnetic crystal can be obtained by a combined process of the reverse micelle method and the sol-gel method as well as a calcination process, as disclosed in Jian Jin, Shinichi Ohkoshi and Kazuhito Hashimoto, ADVANCED MATERIALS 2004, 16, No. 1, January 5, pp. 48-51; Shin-ichi Ohkoshi, Shunsuke Sakurai, Jian Jin, Kazuhito Hashimoto, JOURNAL OF APPLIED PHYSICS, 97, 10K312 (2005); Shunsuke Sakurai, Jian Jin, Kazuhito Hashimoto, and Shinichi Ohkoshi, JOURNAL OF THE PHYSICAL SOCIETY OF JAPAN, Vol. 74, No. 7, July 2005, pp. 1946-1949; Asuka Namai, Shunsuke Sakurai, Makoto Nakajima, Tohru Suemoto, Kazuyuki Matsumoto, Masahiro Goto, Shinya Sasaki, and Shinichi Ohkoshi, Journal of the American Chemical Society, Vol. 131, pp. 1170-1173, 2009; and the like.

In the reverse micelle method, two types of micellar solutions including a surfactant, i.e., a micellar solution I (raw material micelle) and a micellar solution II (neutralizer micelle) are blended, thereby causing precipitation reaction of iron hydroxide in a micelle. Thereafter, surfaces of iron hydroxide particulates generated in the micelle are subjected to silica coating, by the sol-gel method. The iron hydroxide particulates with a silica coating layer are separated from liquid and then subjected to heat treatment in an atmospheric environment at a predetermined temperature (within a range of 700 to 1300° C.). This heat treatment creates ε-Fe$_2$O$_3$ crystal particulates.

More specifically, the M-substituted ε-Fe$_2$O$_3$ magnetic crystal is manufactured, for example, as follows.

First, in an aqueous phase of the micellar solution I with an oil phase being n-octane: iron (III) nitrate as an iron source; M nitrate as an M element source for substituting a part of iron (in the case of Al, aluminum (III) nitrate nonahydrate; in the case of Ga, gallium (III) nitrate hydrate; in the case of In, indium (III) nitrate trihydrate); and in the case of Ti and Co, titanium (IV) sulfate hydrate and cobalt (II) nitrate hexahydrate; and a surfactant (e.g., cetyltrimethylammonium bromide) are dissolved.

An appropriate amount of nitrate of an alkali earth metal (Ba, Sr, Ca, etc.) can be dissolved in advance in an aqueous phase of the micellar solution I. The nitrate functions as a shape controlling agent. Under the presence of the alkali earth metal in the solution, rod-shaped particles of the M-substituted ε-Fe$_2$O$_3$ magnetic crystal are finally obtained. Without any shape controlling agent, near-spherical particles of the M-substituted ε-Fe$_2$O$_3$ magnetic crystal are obtained.

The alkali earth metal added as the shape controlling agent may remain on a surface portion of the M-substituted ε-Fe$_2$O$_3$ magnetic crystal being generated. A mass of the alkali earth metal in the M-substituted ε-Fe$_2$O$_3$ magnetic crystal is preferably no greater than 20% by mass and more preferably no greater than 10% by mass with respect to a total mass of the substitution element M and Fe in the M-substituted ε-Fe$_2$O$_3$ magnetic crystal.

Ammonia aqueous solution is used as an aqueous phase of the micellar solution II with an oil phase being n-octane.

After blending the micellar solution I and the micellar solution II, the sol-gel method is applied. That is, stirring is continued during dropwise addition of silane (e.g., tetraethyl orthosilane) to the micellar solution mixture, thereby causing formation reaction of iron hydroxide or element M-containing iron hydroxide in a micelle. As a result, surfaces of precipitated particulates of iron hydroxide generated in the micelle are coated with silica generated by hydrolysis of the silane.

Thereafter, particle powder obtained by separating from liquid, washing, and then drying the silica-coated M element-containing iron hydroxide particles is fed into a furnace, and subjected to heat treatment (calcination) in the air within a temperature range of 700° C. or more and 1300° C. or less, preferably 900° C. or more and 1200° C. or less, and further preferably 950° C. or more and 1150° C. or less. The heat treatment causes an oxidation reaction in the silica coating, thereby changing particulates of the M element-containing iron hydroxide into particulates of the M-substituted ε-Fe$_2$O$_3$.

Upon this oxidation reaction, the silica coating contributes to generation of an M-substituted ε-Fe$_2$O$_3$ crystal having the same space group as that of ε-Fe$_2$O$_3$, instead of α-Fe$_2$O$_3$ or γ-Fe$_2$O$_3$ crystal, and has also an effect of preventing sintering of particles. In addition, an appropriate amount of an alkali earth metal promotes growth of the particles in a rod-like shape.

In addition, as described above, the M-substituted ε-Fe$_2$O$_3$ magnetic crystal can be synthesized more economically advantageously by the combined process of the direct synthesis method and the sol-gel method as disclosed in Japanese Unexamined Patent Application Publication No. 2008-174405, as well as a calcination process.

In brief, by firstly adding a neutralizer such as an ammonia aqueous solution to an aqueous solvent in which a trivalent iron salt and a salt of the substitution element M (Ga, Al, etc.) are dissolved while stirring, a precursor composed of iron hydroxide (which may have been partially substituted by other elements) is formed.

Thereafter, the sol-gel method is applied thereto, thereby forming a coating layer of silica on surfaces of precursor particles. After being separated from the liquid, the silica-coated particles are subjected to heat treatment (calcination) at a predetermined temperature, thereby obtaining particulates of the M-substituted ε-Fe$_2$O$_3$ magnetic crystal.

In the above-described synthesis of the M-substituted ε-Fe$_2$O$_3$, an iron oxide crystal (impurity crystal) having a space group and an oxidized state different from those of the ε-Fe$_2$O$_3$ crystal may be generated. The most common examples of polymorphism, which has a composition of Fe$_2$O$_3$ with different crystal structures, include α-Fe$_2$O$_3$ and γ-Fe$_2$O$_3$. Other iron oxides include FeO, Fe$_3$O$_4$, and the like. Presence of such impurity crystals is not preferable in terms of maximizing the characteristics of the M-substituted ε-Fe$_2$O$_3$ crystal, but is acceptable without interfering with the effect of the present invention.

In addition, a coercive force $H_c$ of the M-substituted ε-Fe$_2$O$_3$ magnetic crystal varies depending on an amount substituted by the substitution element M. In other words, by adjusting the substitution amount by the substitution element M in the M-substituted ε-Fe$_2$O$_3$ magnetic crystal, the coercive force $H_c$ of the M-substituted ε-Fe$_2$O$_3$ magnetic crystal can be adjusted. Specifically, for example, in a case in which Al, Ga, or the like is used as the substitution element M, a greater substitution amount results in a lower coercive force $H_c$ of the M-substituted $\varepsilon$-$Fe_2O_3$ magnetic crystal. In contrast, in a case in which Rh or the like is used as the substitution element M, a greater substitution amount results in a greater coercive force $H_c$ of the M-substituted $\varepsilon$-$Fe_2O_3$ magnetic crystal. Ga, Al, In, Ti, Co, and Rh are preferred as the substitution element M from the viewpoint of easy adjustment of the coercive force $H_c$ of the M-substituted $\varepsilon$-$Fe_2O_3$ magnetic crystal in accordance with the substitution amount by the substitution element M.

Along with the lowering of the coercive force $H_c$, a peak frequency, at which a radio wave absorption amount by the epsilon-type iron oxide is maximum, moves toward a lower frequency side or a higher frequency side. That is, a peak frequency of the radio wave absorption amount can be controlled by the substitution amount by the substitution element M.

In the case of commonly used radio wave absorbers, the absorption amount becomes almost zero if an incident angle or a frequency of a radio wave is out of a designed value. In contrast, in the case of using the epsilon-type iron oxide, even if those values are slightly out of the designed values, radio wave absorption is exhibited over a broad range of frequencies and radio wave incident angles. Given this, a radio wave absorbing layer that can absorb radio waves over a broad frequency band can be provided.

A particle size of the epsilon-type iron oxide can be controlled by, for example, adjusting the temperature of the heat treatment (calcination) in the above-described process. According to the combined process of the reverse micelle method and the sol-gel method, or the combined process of the direct synthesis method and the sol-gel method as disclosed in Japanese Unexamined Patent Application Publication No. 2008-174405, particles of epsilon-type iron oxide can be synthesized, which has a particle size within a range of 5 nm or more and 200 nm or less as an average particle size as measured from a TEM (transmission electron microscope) photograph. The average particle size of the epsilon-type iron oxide is more preferably 10 nm or more and more preferably 20 nm or more. It should be noted that, when calculating the average particle size as a number average particle size, if the particles of epsilon-type iron oxide are rod-shaped, a diameter in a longitudinal direction of the particle observed in a TEM photograph is considered to be a diameter of the particle. The number of particles to be counted for calculating the average particle size is not particularly limited as long as it is large enough to calculate an average value thereof; however, preferably 300 or more.

In addition, the silica coated on a surface of the iron hydroxide particulate in the sol-gel method may remain on a surface of the M-substituted $\varepsilon$-$Fe_2O_3$ magnetic crystal after the heat treatment (calcination). Presence of a non-magnetic compound such as silica on the surface of the crystal is preferable for improving handleability, durability, weather resistance, and the like of the magnetic crystal. Preferable examples of the non-magnetic compound other than silica include heat resistant compounds such as alumina and zirconia.

However, an excessive amount of the non-magnetic compound attached may cause heavy aggregation of particles and is therefore not preferable. In a case in which the non-magnetic compound is silica, a mass of Si in the M-substituted $\varepsilon$-$Fe_2O_3$ magnetic crystal is preferably 100% by mass or less with respect to a total mass of the substitution element M and Fe in the M-substituted $\varepsilon$-$Fe_2O_3$ magnetic crystal. A part or a large part of silica attached to the M-substituted $\varepsilon$-$Fe_2O_3$c magnetic crystal can be removed by a method of immersion in an alkaline solution. The amount of silica to be attached can thus be adjusted to any desired amount.

A content of the magnetic substance in the radio wave absorbing layers 2 is not particularly limited without interfering with the objective of the present invention. The content of the magnetic substance is preferably 30% by mass or more, more preferably 40% by mass or more, particularly preferably 60% by mass or more, and most preferably 60% by mass or more and 91% by mass or less with respect to a solid content mass of the radio wave absorbing layers 2.

((Relative Permittivity Adjustment Method))

Relative permittivity of the radio wave absorbing layers 2 is not particularly limited, but is preferably 6.5 or more and 65 or less, more preferably 10 or more and 50 or less, and further preferably 15 or more and 30 or less. A method of adjusting the relative permittivity of the radio wave absorbing layers 2 is not particularly limited. Examples of a method of adjusting the relative permittivity of each of the radio wave absorbing layers 2 include a method of adding dielectric powder to the radio wave absorbing layer 2 while adjusting a content of the dielectric powder.

Preferred examples of the dielectric include barium titanate, strontium titanate, calcium titanate, magnesium titanate, bismuth titanate, zirconium titanate, zinc titanate, and titanium dioxide. The radio wave absorbing layers 2 can include a combination of multiple types of dielectric powder.

A particle size of the dielectric powder used for adjusting the relative permittivity of the radio wave absorbing layers 2 is not particularly limited without interfering with the objective of the present invention. An average particle size of the dielectric powder is preferably 1 nm or more and 100 nm or less, and more preferably 5 nm or more and 50 nm or less. The average particle size of the dielectric powder is a number average particle size of primary particles of the dielectric powder observed by an electron microscope.

In a case of adjusting the relative permittivity of the radio wave absorbing layers 2 using the dielectric powder, an amount of the dielectric powder to be used is not particularly limited as long as the relative permittivity of each of the radio wave absorbing layers 2 is within a predetermined range. An amount of the dielectric powder to be used is preferably 0% by mass or more and 20% by mass or less and more preferably 5% by mass or more and 10% by mass or less with respect to a solid content mass of each of the radio wave absorbing layers 2.

Alternatively, by adding a carbon nanotube to the radio wave absorbing layers 2, the relative permittivity can be adjusted. The carbon nanotube may be used together with the above-described dielectric powder.

An amount of the carbon nanotube to be incorporated in the radio wave absorbing layers 2 is not particularly limited as long as the relative permittivity of the radio wave absorbing layers 2 is within the above-mentioned predetermined range. However, since the carbon nanotube is also a conductive material, an excessive amount of the carbon nanotube may deteriorate a radio wave absorbing property provided by the radio wave absorbing layers 2. An amount of the carbon nanotube to be used is preferably 0% by mass or more and 20% by mass or less and more preferably 1% by mass or more and 10% by mass or less with respect to a solid content mass of the radio wave absorbing layers 2.

((Relative Magnetic Permeability Adjustment Method))

Relative magnetic permeability of the radio wave absorbing layers 2 is not particularly limited, but is preferably 1.0 or more and 1.5 or less. A method of adjusting the relative magnetic permeability of the radio wave absorbing layers 2 is not particularly limited. Examples of a method of adjusting the relative magnetic permeability of each of the radio wave absorbing layers 2 include a method of adjusting the substitution amount by the substitution element M in the epsilon-type iron oxide as described above, a method of adjusting a content of the magnetic substance in the radio wave absorbing layers 2, and the like.

((Polymer))

In order to facilitate formation of the radio wave absorbing layers 2 having a uniform thickness while the above-mentioned magnetic substance, or the like is uniformly dispersed in the radio wave absorbing layers 2, the radio wave absorbing layers 2 may include a polymer. When the radio wave absorbing layers 2 include the polymer, a component of the above-mentioned magnetic substance, etc. can be easily dispersed in a matrix composed of the polymer.

A type of the polymer is not particularly limited without interfering with the objective of the present invention, as long as formation of the radio wave absorbing layers 2 is allowed. The polymer may also be an elastic material such as an elastomer or a rubber. The polymer can be either a thermoplastic resin or a curable resin. In the case of the curable resin, the curable resin can be either a photocurable resin or a thermosetting resin.

Preferred examples of the polymer being the thermoplastic resin include polyacetal resin, a polyamide resin, a polycarbonate resin, a polyester resin (polybutylene terephthalate, polyethylene terephthalate, polyarylate, and the like), an FR-AS resin, an FR-ABS resin, an AS resin, an ABS resin, a polyphenylene oxide resin, a polyphenylene sulfide resin, a polysulfone resin, a polyether sulfone resin, a polyether ether ketone resin, a fluorine-based resin, a polyimide resin, a polyamide-imide resin, a polyamide bis-maleimide resin, a polyetherimide resin, a polybenzoxazole resin, a polybenzothiazole resin, a polybenzimidazole resin, a BT resin, polymethylpentene, ultra-high molecular weight polyethylene, FR-polypropylene, a cellulose resin (e.g., methylcellulose, ethylcellulose), a (meta)acrylic resin (polymethyl methacrylate and the like), polystyrene, and the like.

Preferred examples of the polymer being the thermosetting resin include a phenolic resin, a melamine resin, an epoxy resin, an alkyd resin, and the like. As the photocurable resin, a resin obtained by photocurable of various vinyl monomers or various monomers having an unsaturated bond such as (meth)acrylic ester can be used.

Preferred examples of the polymer being the elastic material include an olefin-based elastomer, a styrene-based elastomer, a polyamide-based elastomer, a polyester-based elastomer, a polyurethane-based elastomer, and the like.

In a case in which the radio wave absorbing layers 2 include the polymer, a content of the polymer is not particularly limited without interfering with the objective of the present invention. The content of the polymer is preferably 5% by mass or more and 30% by mass or less and more preferably 10% by mass or more and 25% by mass or less with respect to a solid content mass of the radio wave absorbing layers 2.

((Dispersant))

In order to favorably disperse the above-mentioned magnetic substance and a substance to be added for adjusting the relative permittivity and the relative magnetic permeability in the radio wave absorbing layers 2, the radio wave absorbing layers 2 can include a dispersant. The dispersant can be blended uniformly along with the above-mentioned magnetic substance, the polymer, and the like. When the radio wave absorbing layers 2 include the polymer, the dispersant may be incorporated in the polymer. Furthermore, the above-mentioned magnetic substance and the substance to be added for adjusting the relative permittivity and the relative magnetic permeability that are treated with the dispersant in advance can be incorporated into a material constituting the radio wave absorbing layers 2.

A type of the dispersant is not particularly limited without interfering with the objective of the present invention. The dispersant can be selected from various dispersants conventionally used for dispersion of various inorganic particulates or organic particulates.

Preferred examples of the dispersant include a silane coupling agent (e.g., phenyltrimethoxysilane), a titanate coupling agent, a zirconate coupling agent, an aluminate coupling agent, and the like.

A content of the dispersant is not particularly limited without interfering with the objective of the present invention. The content of the dispersant is preferably 0.1% by mass or more and 30% by mass or less, more preferably 1% by mass or more and 15% by mass or less, and particularly preferably 1% by mass or more and 10% by mass or less with respect to a solid content mass of each of the radio wave absorbing layers 2.

((Other Components))

The radio wave absorbing layers 2 may include various additives other than the above-mentioned components without interfering with the objective of the present invention. Examples of the additives that may be included in the radio wave absorbing layers 2 include a coloring agent, an antioxidant, a UV absorber, a fire retardant, a fire retardant aid, a plasticizer, a surfactant, and the like. These additives are used without interfering with the objective of the present invention, taking into consideration conventionally used amounts thereof.

The radio wave absorbing layers 2 may each have a curved surface or be only composed of a planar surface, and is preferably a flat plate shape. A thickness of each of the two radio wave absorbing layers 2 is preferably 700 μm or less, more preferably 300 μm or less, further preferably 150 μm or less, and particularly preferably 100 μm or less from the viewpoint of thinning or downsizing of the film without impairing the effect of the present invention. The lower limit of the thickness of each of the radio wave absorbing layers 2 is not particularly limited without impairing the effect of the present invention, but, for example, 1 μm or more, 10 μm or more, 50 μm or more, or the like.

((Radio Wave Absorbing Layer Forming Paste))

A method for producing the radio wave absorbing layer is preferably a method of using a radio wave absorbing layer forming paste from the viewpoints of the possibility of forming the radio wave absorbing layer with high efficiency without limitation of thickness and the possibility of forming the radio wave absorbing layer directly on the substrate layer. The radio wave absorbing layer forming paste preferably includes the above-mentioned magnetic substance. The radio wave absorbing layer forming paste may include the substances added for adjusting relative permittivity and relative magnetic permeability, the polymer, and the other components, and the like, as described for the radio wave absorbing layer. When the polymer is a curing resin, the radio wave absorbing layer forming paste includes a compound that is a precursor of the curing resin. In this case, the radio wave absorbing layer forming paste includes a curing agent, a curing promoter, a polymerization initiator, and the like as necessary.

Furthermore, when the radio wave absorbing layer forming paste includes a photopolymerizable or thermopolymerizable compound, the radio wave absorbing layer can be formed by exposing or heating a film on which the paste is applied.

The radio wave absorbing layer forming paste preferably further includes a dispersion medium. However, the dispersion medium is not necessarily needed if the radio wave absorbing layer forming paste includes a liquid precursor of a curable resin such as a liquid epoxy compound.

As the dispersion medium, water, an organic solvent, and an aqueous solution of an organic solvent can be used. As the dispersion medium, the organic solvent is preferable, since the organic solvent can easily dissolve organic components and has low latent heat of vaporization allowing easy removal by drying.

Preferred examples of the organic solvent to be used as the dispersion medium include: nitrogen-containing polar solvents such as N,N,N',N'-tetramethylurea (TMU), N-methyl-2-pyrrolidone (NMP), N,N-dimethylacetamide (DMAc), N,N-dimethylisobutylamide, N,N-diethylacetamide, N,N-dimethylformamide (DMF), N,N-dimethylformamide, N,N-methylcaprolactam, 1,3-dimethyl-2-imidazolidinone (DMI), and pyridine; ketones such as diethyl ketone, methylbutyl ketone, dipropylketone, and cyclohexanone; alcohols such as n-pentanol, 4-methyl-2-pentanol, cyclohexanol, and diacetone alcohol; ether-based alcohols such as ethylene glycol monomethyl ether, ethylene glycol monoethyl ether, ethylene glycol monobutyl ether, propylene glycol monomethyl ether, propylene glycol monoethyl ether, diethylene glycol monomethyl ether, diethylene glycol monoethyl ether, diethylene glycol dimethyl ether, and diethylene glycol diethyl ether; saturated aliphatic monocarboxylate alkyl esters such as n-butyl acetate and amyl acetate; lactate esters such as ethyl lactate and n-butyl lactate; and ether-based esters such as methylcellosolve acetate, ethylcellosolve acetate, propylene glycol monomethyl ether acetate, propylene glycol monoethyl ether acetate, ethyl-3-ethoxypropionate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, and 2-methoxypentyl acetate, and the like. These may be used singly or in combination of two or more.

A solid content concentration of the radio wave absorbing layer forming paste is appropriately adjusted in accordance with a method of applying the radio wave absorbing layer forming paste, a thickness of the radio wave absorbing layer, or the like. Typically, the solid content concentration of the radio wave absorbing layer forming paste is preferably 3% by mass or more and 60% by mass or less and more preferably 10% by mass or more and 50% by mass or less. It should be noted that the solid content concentration of the paste is a value calculated by considering a total of a mass of a component not dissolved in the dispersion medium and a mass of a component dissolved in the dispersion medium as a solid content mass.

<Core Layer>

In the first aspect, the two substrate layers 4 are laminated on both surfaces of a core layer 3. The core layer 3 includes at least one metal layer from the viewpoint of blockage of millimeter-waves. Examples of the above-mentioned metal layer include layers including aluminum, titanium, SUS, copper, brass, silver, gold, platinum, or alloys thereof from the viewpoint of more secure achievement of the effect of the present invention.

The core layer 3 may or may not include a layer other than the above-mentioned metal layer. The layer other than the above-mentioned metal layer may be any layer without impairing the effect of the present invention, and examples thereof include a bonding layer or an adhesive layer between the above-mentioned metal layer and the substrate layer 4. Examples of the above-mentioned bonding layer or adhesive layer include an acrylic-based adhesive layer, a rubber-based adhesive layer, a silicone-based adhesive layer, a urethane-based adhesive layer, and the like.

The core layer 3 may have a curved surface or be only composed of a planar surface, and is preferably a flat plate shape. A thickness of the core layer 3 is preferably 600 μm or less, more preferably 400 μm or less, further preferably 100 μm or less, and particularly preferably 50 μm or less from the viewpoint of thinning or downsizing of the film without impairing the effect of the present invention. The lower limit of the thickness of the core layer 3 is not particularly limited without impairing the effect of the present invention, but, for example, 1 μm or more, 5 μm or more, 10 μm or more, or the like.

<Two Substrate Layer>

In the first aspect, the two substrate layers 4 are laminated on both surfaces of the core layer 3; the radio wave absorbing layer 2 is laminated on a surface opposite to the core layer 3 for each of the two substrate layers 4; and constitution (composition, thickness, physical property, and the like) of the two substrate layers 4 may be the same as or different from each other. The substrate layers 4 may be a layer including any substrate without impairing the effect of the present invention, and examples thereof include layers including a resin. Examples of the above-mentioned resin include polyethylene terephthalate (PET), polyethylene naphthalate (PEN), acrylic (PMMA), polycarbonate (PC), a cycloolefin polymer (COP), polyether sulfone, polyimide, polyamide-imide, and the like. Among them, PET is preferable because of excellent heat resistance and well-balanced dimension stability and cost.

Each of the substrate layers 4 may have a curved surface or be only composed of a planar surface, and is preferably a flat plate shape. A thickness of each of the two substrate layers 4 is preferably 800 μm or less, more preferably 500 μm or less, further preferably 300 μm or less, and particularly preferably 150 μm or less from the viewpoint of thinning or downsizing of the film without impairing the effect of the present invention. The lower limit of the thickness of each of the substrate layers 4 is not particularly limited without impairing the effect of the present invention, but, for example, 1 μm or more, 10 μm or more, 50 μm or more, or the like.

<Application>

The radio wave absorbing laminate film according to the first aspect can be used as a radio wave absorbing film to be used for a variety of elements (including automotive elements, high-frequency antenna elements, etc.) in various information communication systems such as cellular telephones, wireless LANs, ETC systems, intelligent transport systems, driving support road systems, satellite broadcasting, and the like <<Production Method of Radio Wave Absorbing Laminate Film>>

<Production Method According to Second Aspect>

A method for producing a radio wave absorbing laminate film according to the second aspect is a method for producing the radio wave absorbing laminate film according to the first aspect, the method including: (a1) performing formation of a laminated product at least twice including the radio wave absorbing layer and the substrate layer through formation of the radio wave absorbing layer on the substrate layer, thereby obtaining at least two laminated products; and (b1) laminating a surface of the substrate layer of the laminated product onto each of both surfaces of the core layer.

(For the Above-Mentioned (a1))

A method for forming a laminated product including the radio wave absorbing layer and the substrate layer through formation of the radio wave absorbing layer on the substrate layer is not particularly limited, and the substrate layer and the radio wave absorbing layer may be separately formed and then laminated on each other or the radio wave absorbing layer may be formed directly on a surface of the substrate layer. Herein, lamination of two layers includes not only a state in which the two layers are joined so as not to be easily detached from each other by external force, but also a state in which the two layers are merely superposed so that the layers may be easily shifted or detached from each other by external force. When the lamination is in the latter state, layers in the laminated product are preferably fixed to each other at any position on the radio wave absorbing laminate film so that the layers constituting the radio wave absorbing laminate film are not easily shifted or detached from each other. Examples of the fixing method include a method in which at least one position on an outer circumference portion of the radio wave absorbing laminate film is clamped with a fixing member such as a clip, a method in which the layers constituting the radio wave absorbing laminate film are fixed by allowing a fixture such as a screw to penetrate therethrough, a method in which the layers are sewn together at any position on the radio wave absorbing laminate film, and the like.

When the substrate layer and the radio wave absorbing layer are separately formed and then laminated on each other, the lamination method is not particularly limited. One preferred example of the lamination method includes a method in which the radio wave absorbing layer and the substrate layer are bonded to each other with an adhesive or a tackifier, as necessary.

When components constituting the radio wave absorbing layer include a thermoplastic polymer, a mixture composed of essential or optional components included in the radio wave absorbing layer can be used to produce the radio wave absorbing layer using known methods such as extrusion molding, injection molding, press molding, or the like. In this case, the substrate layer may be used as an insert material to integrate the substrate layer and the radio wave absorbing layer using a well-known insert molding method. These methods have an advantage of high production efficiency, but have a disadvantage of difficulty in producing a thin radio wave absorbing layer having a thickness of less than 1 mm.

Meanwhile, the above-mentioned method for forming a laminated product including the radio wave absorbing layer and the substrate layer by forming the radio wave absorbing layer on the substrate layer using the radio wave absorbing layer forming paste is preferable from the viewpoints of the possibility of forming the radio wave absorbing layer with high efficiency without limitation of thickness and the possibility of forming the radio wave absorbing layer directly on the substrate layer. A method for applying the radio wave absorbing layer forming paste onto the substrate layer is not particularly limited as long as a radio wave absorbing layer having a desired thickness can be formed. Examples of the application method include a spray coating method, a dip coating method, a roll coating method, a curtain coating method, a spin coating method, a screen printing method, a doctor blade method, and an applicator method, and the like. An applied film formed by the above-mentioned method may be dried to remove a dispersion medium, thereby forming the radio wave absorbing layer. A thickness of the applied film is appropriately adjusted so that a thickness of the thus-dried radio wave absorbing layer is a desired thickness. A drying method is not particularly limited, and examples thereof include (1) a method of drying the film on a hot plate at a temperature of 80° C. or more and 180° C. or less and preferably 90° C. or more and 160° C. or less for 1 minute or more and 30 minutes or less, (2) a method of leaving to stand the film at room temperature for several hours to several days, (3) a method of placing the film in a warm air heater or an infrared heater for several tens of minutes to several hours, thereby removing a solvent, and the like.

(For the Above-Mentioned (b1))

A method for laminating a surface of the substrate layer of the laminated product including the radio wave absorbing layer and the substrate layer onto each of both surfaces of the core layer is not particularly limited. Examples of the lamination method include a method in which each of both surfaces of the core layer is joined to the surface of the substrate layer. The joining method is not particularly limited. One preferred example of the joining method includes a method in which each of surfaces of the core layer and the surface of the substrate layer are bonded to each other with an adhesive or a tackifier, as necessary.

<Production Method According to Third Aspect>

A method for producing a radio wave absorbing laminate film according to the third aspect is a method for producing the radio wave absorbing laminate film according to the first aspect, the method including:

(a2) laminating the substrate layer onto each of both surfaces of the core layer; and (b2) forming the radio wave absorbing layer on each of the two substrate layers laminated on the core layer.

(For the Above-Mentioned (a2))

The method for laminating the substrate layer onto each of both surfaces of the core layer is not particularly limited. In the lamination method, for example, the core layer and the substrate layer may be separately formed and then joined to each other or the substrate layer may be formed directly on a surface of the core layer.

When the core layer and the substrate layer are separately formed and then joined to each other, the lamination method is not particularly limited. Preferred examples of the joining method include a method in which the core layer and the substrate layer are bonded to each other with an adhesive or a tackifier, as necessary.

When components constituting the substrate layer include a thermoplastic polymer, a mixture composed of components included in the substrate layer can be used to produce the substrate layer using known methods such as extrusion molding, injection molding, press molding, and the like. In this case, the core layer may be used as an insert material to integrate the core layer and the substrate layer using a well-known insert molding method.

A method for applying a substrate layer forming composition onto the core layer is not particularly limited as long as a substrate layer having a desired thickness can be formed. Examples of the application method include a spray coating method, a dip coating method, a roll coating method, a curtain coating method, a spin coating method, a screen printing method, a doctor blade method, and an applicator method, and the like.

(For the Above-Mentioned (b2))

A method for forming the radio wave absorbing layer on each of the two substrate layers laminated on the core layer is not particularly limited, and the radio wave absorbing layers may be separately formed and then laminated on the two substrate layers or the radio wave absorbing layer may be formed directly on a surface of the substrate layer.

The method for forming the radio wave absorbing layer on the substrate layer may be the same as described for the above-mentioned (a1). Examples of the method for forming the radio wave absorbing layer directly on a surface of the substrate layer include the method of applying the radio wave absorbing layer forming paste onto the substrate layer as described for the (a1), and the like.

In the methods for producing the radio wave absorbing laminate film according to the second and third aspects, the radio wave absorbing layer is preferably formed by applying the radio wave absorbing layer forming paste including the magnetic substance onto the substrate layer.

<<Element>>

An element according to the fourth aspect includes the radio wave absorbing laminate film according to the first aspect. Examples of the element according to the fourth aspect include a variety of elements (automotive elements, high-frequency antenna elements, etc.) in various information communication systems such as cellular telephones, wireless LANs, ETC systems, intelligent transport systems, driving support road systems, satellite broadcasting, and the like. Examples of the automotive elements include automotive elements for driving support road systems, for example, automotive radars that detect information such as an inter-vehicular distance utilizing millimeter-waves in a 76-GHz band.

The above-mentioned high-frequency antenna element preferably further includes a receiving antenna unit. From the viewpoint of serving as an antenna element without significantly attenuating radio waves directly incident on the receiving antenna unit, the above-mentioned high-frequency antenna element more preferably includes the radio wave absorbing laminate film according to the first aspect so that the film imparts a radio wave absorbing property to the high-frequency antenna element as a whole, but does not attenuate radio waves directly incident on the receiving antenna unit to the degree that the high-frequency antenna element cannot execute a desired operation. Specific examples of a configuration of the above-mentioned high-frequency antenna element include a configuration in which the radio wave absorbing laminate film according to the first aspect covers a surface on which the receiving antenna unit is not mounted, the above-mentioned radio wave absorbing laminate film may or may not be in contact with the entire side surface of the receiving antenna unit, and may or may not cover at least a part of an upper surface of the receiving antenna unit. For the above-mentioned high-frequency antenna element, the receiving antenna unit is generally connected to the other parts by wiring. Therefore, the high-frequency antenna element may have a configuration including a terminal provided at any position on a surface of the high-frequency antenna element and wiring for connecting the terminal and the receiving antenna unit.

EXAMPLES

Hereinafter, the present invention will be described in more detail based on Examples, but is not limited thereto.

[Production of Radio Wave Absorbing Laminate Film of Example 1 and Laminate Films of Comparative Examples 1 to 3]

(Preparation of Radio Wave Absorbing Layer Forming Paste)

The below-mentioned epsilon-type iron oxide (35.1% by mass), the below-mentioned carbon nanotube (CNT) (2.2% by mass), the below-mentioned dispersant (3.5% by mass), and the below-mentioned resin (8.3% by mass) were added to TMU (50.9% by mass) and uniformly dissolved or dispersed therein, thereby obtaining a radio wave absorbing layer forming paste. It should be noted that a solid content concentration of the radio wave absorbing layer forming paste was 49.1% by mass.

As the epsilon-type iron oxide, $\varepsilon\text{-}Ga_{0.45}Fe_{1.55}O_3$ was used. The epsilon-type iron oxide had an average particle size of 20 nm or more and 30 nm or less. As the CNT, a multilayered carbon nanotube having a major axis of 150 nm (commercial name: VGCF-H; manufactured by Showa Denko K.K.) was used. As the dispersant, phenyltrimethoxysilane was used. As the resin, ethylcellulose was used.

(Formation of Laminate Product Including Radio Wave Absorbing Layer and Substrate Layer)

Figure 2A:
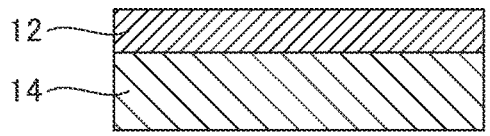
FIG. 2 illustrates cross-sectional views of laminate films of Comparative Examples 1 to 3.

The above-mentioned radio wave absorbing layer forming paste was applied onto a PET film (thickness: 125 μm) using an applicator and then dried at 90° C. for 20 minutes and at 130° C. for 20 minutes, thereby forming a radio wave absorbing layer having a thickness of 70 μm on the PET film. Thus, at least six laminated products (total thickness: about 200 μm) each including a radio wave absorbing layer and a substrate layer illustrated in FIG. 2A were obtained. One of the above-mentioned laminated products serving as a laminate film of Comparative Example 1 was subjected to transmission attenuation and reflection attenuation tests described below. FIG. 2A is a cross-sectional view of the laminate film of Comparative Example 1. In FIG. 2A, a reference numeral 12 denotes a radio wave absorbing layer and a reference numeral 14 denotes a substrate layer (PET film).

Figure 2B:
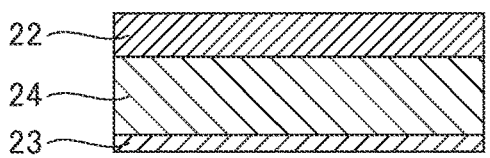
Figure 2C:
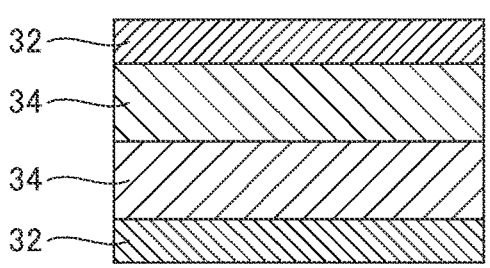

Two of the above-mentioned laminated products were used to laminate the PET films on each other, thereby forming a laminated product (total thickness: about 400 μm) of Comparative Example 3 illustrated in FIG. 2C. This was subjected to transmission attenuation and reflection attenuation tests described below. In FIG. 2C, a reference numeral 32 denotes a radio wave absorbing layer and a reference numeral 34 denotes a substrate layer (PET film).

(Lamination of Laminate Product and Metal Layer)

One of the above-mentioned laminated products was used to laminate an aluminum metal sheet having a thickness of 20 μm onto the PET film, thereby forming a laminate film (total thickness: about 220 μm) of Comparative Example 2 illustrated in FIG. 2B. This was subjected to transmission attenuation and reflection attenuation tests described below. In FIG. 2B, a reference numeral 22 denotes a radio wave absorbing layer, a reference numeral 23 denotes a core layer (aluminum metal layer), and a reference numeral 24 denotes a substrate layer (PET film).

One of the above-mentioned laminated products was used to laminate an aluminum metal sheet having a thickness of 20 μm onto the PET film and then the PET film in another one of the above-mentioned laminated products was laminated onto the other surface of the aluminum metal sheet, thereby forming a radio wave absorbing laminate film (total thickness: about 420 μm) of Example 1 illustrated in FIG. 1. This was subjected to transmission attenuation and reflection attenuation tests described below. In FIG. 1, a radio wave absorbing laminate film 1 of Example 1 has a metal layer serving as a core layer 3, PET films serving as two substrate layers 4, and two radio wave absorbing layers 2.

[Transmission Attenuation and Reflection Attenuation Tests]

Radio waves in 30 to 2000 GHz were incident from "above" and "below" illustrated in FIGS. 1 and 2A to 2C on each of the radio wave absorbing laminate film of Example 1 and the laminate films of Comparative Examples 1 to 3 produced as described above and transmission and reflectance spectra were measured using a terahertz spectrometer (manufactured by Advantest Corporation), thereby determining transmission attenuation and reflection attenuation. Transmission attenuation Abs (f) at a frequency f was determined by Abs (f)=−10 Log (T(f)/100)

wherein T (f) is transmittance (%) at the frequency f.

Reflection attenuation RL (f) at a frequency f was determined by RL (f)=−10 Log (T(f)/100)

wherein R (f) is reflectance (%). The results are presented in FIGS. 3 to 6.

Figure 3A:
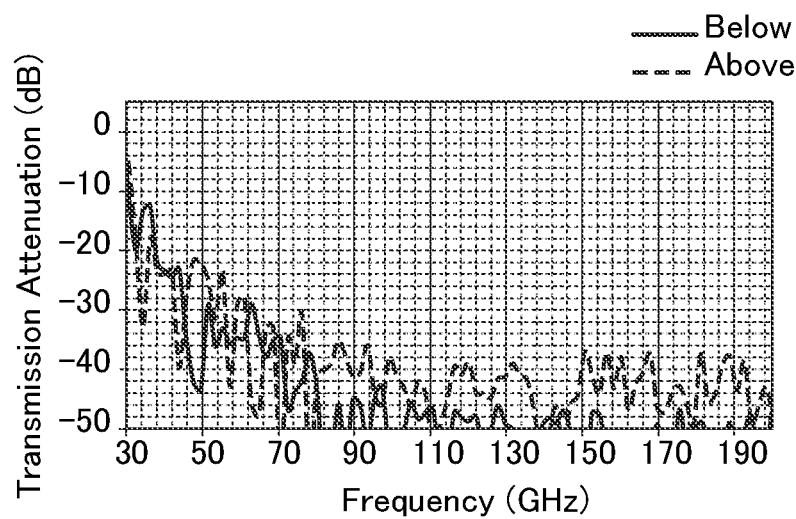
FIG. 3 shows graphs illustrating transmission attenuation and reflection attenuation of the radio wave absorbing laminate film of Example 1 in a millimeter-wave frequency band.
Figure 3B:
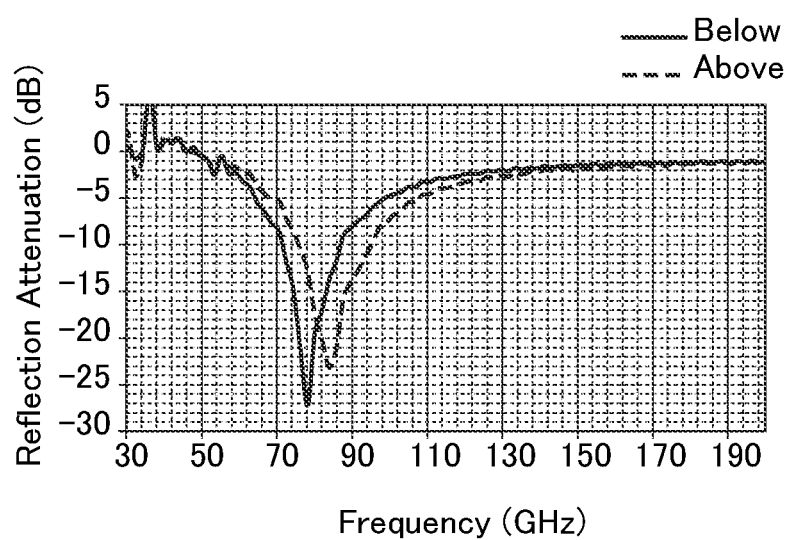

FIG. 3 shows graphs illustrating transmission attenuation and reflection attenuation of the radio wave absorbing laminate film of Example 1 in a frequency band of 30 GHz or more and 200 GHz or less. As illustrated in FIG. 3A, it can be seen that absolute values of the transmission attenuation for incident waves from both "above" and "below" illustrated in FIG. 1 were 10 dB or more in a frequency band of 30 GHz or more and 200 GHz or less, and therefore the transmission attenuation property of the film was good. It is believed that this is because the transmission attenuation was based on an absorption effect by the radio wave absorbing layer and a blocking effect by the metal layer. As illustrated in FIG. 3B, it can be seen that, for reflection attenuation for incident waves from both "above" and "below" illustrated in FIG. 1, there were peaks at which absolute values are 10 dB or more in a frequency band of 30 GHz or more and 200 GHz or less. It is believed that this is because the incident waves from both "above" and "below" were reflected by the metal layer and absorbed into the radio wave absorbing layer.

Figure 4A:
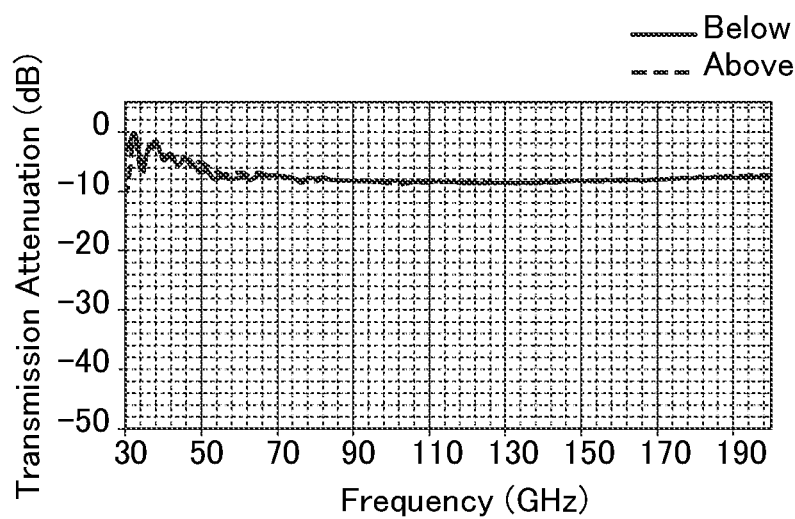
FIG. 4 shows graphs illustrating transmission attenuation and reflection attenuation of the laminate film of Comparative Example 1 in a millimeter-wave frequency band.
Figure 4B:
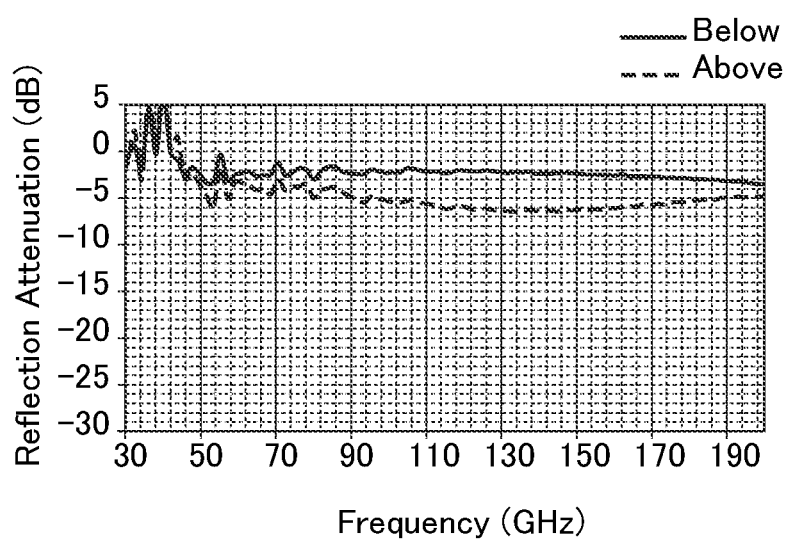

FIG. 4 shows graphs illustrating transmission attenuation and reflection attenuation of the laminate film of Comparative Example 1 in a frequency band of 30 GHz or more and 200 GHz or less. As illustrated in FIG. 4A, it can be seen that there was almost no transmission attenuation for incident waves from both "above" and "below" illustrated in FIG. 2A. It is believed that this is because the transmission attenuation was based on absorption only by the single radio wave absorbing layer. As illustrated in FIG. 4B, it can be seen that there was a slight reflection attenuation for incident waves from "above" illustrated in FIG. 2A but there was almost no reflection attenuation for incident waves from "below". It is believed that this is because the incident waves were not reflected by the metal layer and therefore the reflection attenuation was based only on absorption by the radio wave absorbing layer.

Figure 5A:
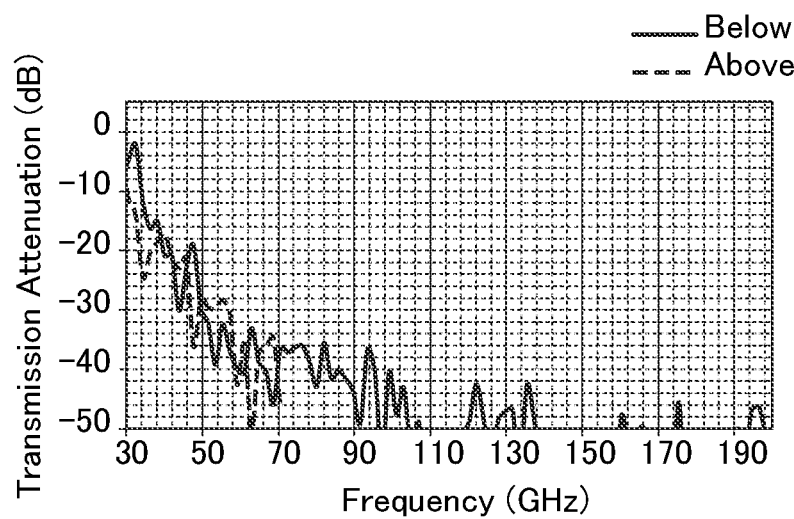
FIG. 5 shows graphs illustrating transmission attenuation and reflection attenuation of the laminate film of Comparative Example 2 in a millimeter-wave frequency band.
Figure 5B:
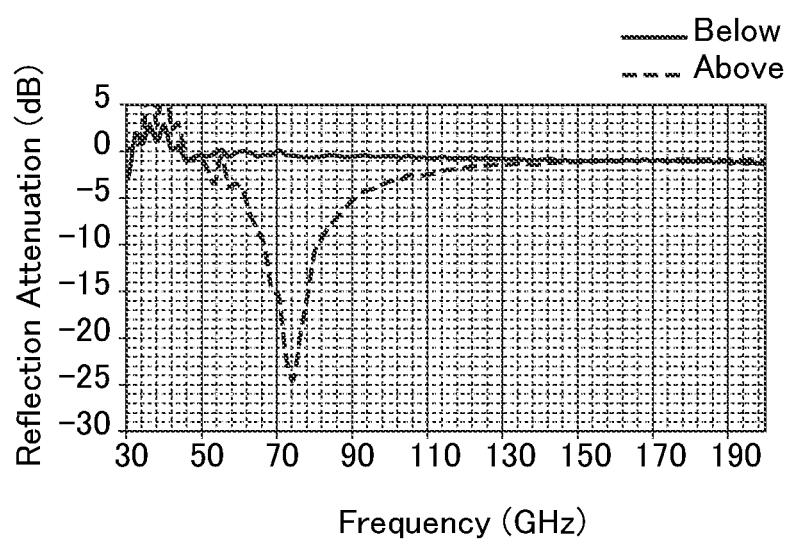

FIG. 5 shows graphs illustrating transmission attenuation and reflection attenuation of the laminate film of Comparative Example 2 in a frequency band of 30 GHz or more and 200 GHz or less. As illustrated in FIG. 5A, it can be seen that absolute values of the transmission attenuation for incident waves from both "above" and "below" illustrated in FIG. 2B were 10 dB or more in a frequency band of 30 GHz or more and 200 GHz or less, and therefore the transmission attenuation property of the film was good. It is believed that this is due to the presence of the metal layer. As illustrated in FIG. 5B, it can be seen that, for reflection attenuation for incident waves from "above" illustrated in FIG. 2B, there was a peak at which an absolute value is 10 dB or more in a frequency band of 30 GHz or more and 200 GHz or less. It is believed that this is because the incident waves were reflected by the metal layer and absorbed into the radio wave absorbing layer. Meanwhile, it can be seen that there was no reflection attenuation for incident waves from "below" illustrated in FIG. 2B because the metal layer totally reflected the incident waves.

Figure 6A:
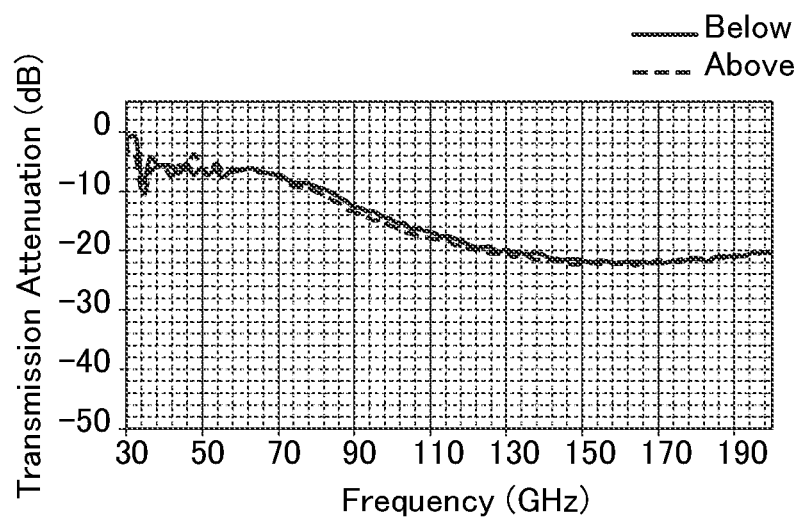
FIG. 6 shows graphs illustrating transmission attenuation and reflection attenuation of the laminate film of Comparative Example 3 in a millimeter-wave frequency band.
Figure 6B:
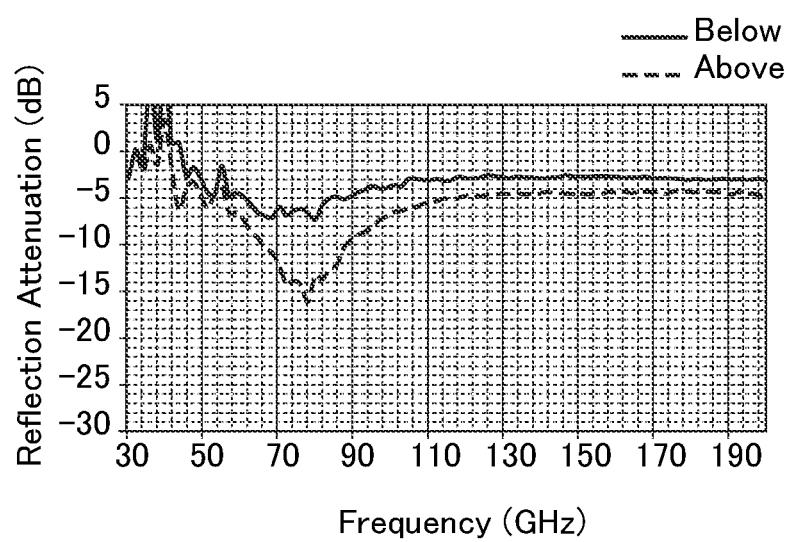

FIG. 6 shows graphs illustrating transmission attenuation and reflection attenuation of the laminate film of Comparative Example 3 in a frequency band of 30 GHz or more and 200 GHz or less. As illustrated in FIG. 6A, it can be seen that the laminate film of Comparative Example 3 had improved transmission attenuation for incident waves from both "above" and "below" illustrated in FIG. 2C due to the presence of two radio wave absorbing layers compared to the laminate film of Comparative Example 1, which had almost no transmission attenuation for incident waves from both "above" and "below", but the transmission attenuation was still unsatisfactory due to the absence of the transmitted wave-blocking effect of the metal layer. As illustrated in FIG. 6B, it can be seen that, for reflection attenuation for incident waves from "above" illustrated in FIG. 2C, there was a peak at which an absolute value is 10 dB or more in a frequency band of 30 GHz or more and 200 GHz or less, but for reflection attenuation for incident waves from "below", there was only a small peak and there was no peak at which an absolute value is 10 dB or more. It is presumed that, although there were reflection attenuations by surfaces of both radio wave absorbing layers, this is based on the results that stability was lacking because the attenuations were not reflected waves by metal layers.

Based on the results of the above-mentioned transmission attenuation and reflection attenuation tests, the evaluation results of the radio wave absorbing laminate film of Example 1 and the laminate films of Comparative Examples 1 to 3 are summarized according to the following criteria in Table 1 below.

(Transmission Attenuation)

∘: The absolute value of the transmission attenuation was 10 dB or more in a frequency band of 30 GHz or more 200 GHz or less.

x: The absolute value of the transmission attenuation was less than 10 dB in a frequency band of 30 GHz or more 200 GHz or less.

(Reflection Attenuation)

∘: There was a peak at which the absolute value of the reflection attenuation was 10 dB or more in a frequency band of 30 GHz or more 200 GHz or less.

x: There was no peak at which the absolute value of the reflection attenuation was 10 dB or more in a frequency band of 30 GHz or more 200 GHz or less.

TABLE 1

| | Transmission attenuation property | | Reflection attenuation property | | | |
|---|---|---|---|---|---|---|
| | (Incident wave from above) | (Incident wave from below) | (Incident wave from above) | (Incident wave from below) | Total thickness (μm) | Comprehensive evaluation |
| Example 1 | ○ | ○ | ○ | ○ | 420 | ○ |
| Comparative Example 1 | x | x | x | x | 200 | x |
| Comparative Example 2 | ○ | ○ | ○ | x | 220 | x |
| Comparative Example 3 | x | x | x | x | 400 | x |

As evident from the results in Table 1, it can be seen that the radio wave absorbing laminate film of Example 1 had excellent transmission attenuation and reflection attenuation properties for incident waves from both "above" and "below" illustrated in FIG. 1, and exhibited satisfactory radio wave absorbing performance even when designed to be extremely thin of a total thickness of 420 μm or less. Meanwhile, it can be seen that the laminate films of Comparative Examples 1 and 3 had inferior transmission attenuation and reflection attenuation properties. Furthermore, it can be seen that the laminate film of Comparative Example 2 had a satisfactory transmission attenuation property, but had no reflection attenuation because the metal layer totally reflected the incident waves from "below" illustrated in FIG. 2B.

EXPLANATION OF REFERENCE NUMERALS 1 radio wave absorbing laminate film
2 radio wave absorbing layer
3 core layer
4 substrate layer

The invention claimed is:

1. A radio wave absorbing laminate film comprising a core layer, two substrate layers, and two radio wave absorbing layers,
the core layer comprising at least one metal layer,
wherein the two substrate layers are laminated on both surfaces of the core layer,
each of the radio wave absorbing layers are laminated on a surface opposite to the core layer for each of the two substrate layers,
the two substrate layers are either the same as or different from each other, the two radio wave absorbing layers are either the same as or different from each other, and
at least one of the two radio wave absorbing layers comprises a magnetic substance.

2. The radio wave absorbing laminate film according to claim 1, wherein the magnetic substance comprises at least one selected from the group consisting of epsilon-type iron oxide, barium ferrite magnetic substance, and strontium ferrite magnetic substance.

3. The radio wave absorbing laminate film according to claim 2, wherein the epsilon-type iron oxide is at least one selected from the group consisting of an $\varepsilon$-$Fe_2O_3$ crystal; and a crystal of which crystalline structure and space group are the same as those of the 6-$Fe_2O_3$ crystal, in which a part of Fe sites in the $\varepsilon$-$Fe_2O_3$ crystal is substituted by an element M other than Fe, and which is represented by a formula $\varepsilon$-$M_xFe_{2-x}O_3$ wherein x is 0.

4. A method for producing the radio wave absorbing laminate film according to claim 1, the method comprising:
(a1) forming a laminated product at least twice, wherein the laminated product comprises one of the two radio wave absorbing layers and the two substrate layers by forming one of the two radio wave absorbing layers on one of the two substrate layers, thereby obtaining at least two laminated products; and
(b1) laminating a surface of the substrate layer of the laminated product onto each of both surfaces of the core layer.

5. The method according to claim 4, wherein each of the two radio wave absorbing layers is formed by applying a paste comprising the magnetic substance onto each of the two substrate layers.

6. A method for producing the radio wave absorbing laminate film according to claim 1, the method comprising:
(a2) laminating one of the two substrate layers onto both surfaces of the core layer; and
(b2) forming one of the two radio wave absorbing layers on each of the two substrate layers laminated on the core layer.

7. The method according to claim 6, wherein each of the two radio wave absorbing layers is formed by applying a paste comprising the magnetic substance onto each of the two substrate layers.

8. An element comprising the radio wave absorbing laminate film according to claim 1.

* * * * *